United States Patent [19]

Su et al.

[11] Patent Number: 4,956,568
[45] Date of Patent: Sep. 11, 1990

[54] MONOLITHIC SAMPLER

[75] Inventors: Chung-Yi Su, Milpitas; Michael R. Ty Tan, Mountain View; William J. Anklam, Santa Rosa, all of Calif.

[73] Assignee: Hewlett-Packard Company, Palo Alto, Calif.

[21] Appl. No.: 281,423

[22] Filed: Dec. 8, 1988

[51] Int. Cl.$^5$ ........................ H03K 5/12; H03K 17/04; H03K 17/74
[52] U.S. Cl. .................................. 307/352; 307/259; 307/263; 307/317.2; 307/320; 333/20
[58] Field of Search ............... 307/352, 353, 256, 259, 307/320, 317 A, 263, 319; 328/151, 65; 333/20

[56] References Cited

U.S. PATENT DOCUMENTS

| | | | |
|---|---|---|---|
| 3,596,191 | 7/1971 | Stuckert | 307/353 |
| 3,760,283 | 9/1973 | Lockwood | 333/20 |
| 4,594,557 | 6/1986 | Shillady | 307/320 |
| 4,654,600 | 3/1987 | Lockwood | 307/352 |

OTHER PUBLICATIONS

"Nonlinear Transmission Line for Picosecond Pulse Compression and Broadband Phase Modulation": by M. J. M. Rodwell et al., Electronics Letters, vol. 23, No. 3, Jan. 29, 1987, pp. 109-110.
"An Analysis of a Nonlinear Transmission Line", by R. B. Riley, Office of Naval Research Technical Report No. 1707-01, Jan. 20, 1961.
"Shock Waves in Nonlinear Transmission Lines and Their Effect on Parametric Amplification": by R. Landauer, IBM Journal, Oct. 1960, pp. 391-401.
"Forty GHz Frequency Converter Heads", by M. M. Sayed, Hewlett-Packard Journal, vol. 31, Apr. 1980, pp. 14-19.

Primary Examiner—John Zazworsky

[57] ABSTRACT

A Monolithic Sampler is disclosed. The present invention overcomes the problem of inadequately low sampling rates that results from circuit designs or component limitations that constrain the bandwidths of previous instruments. The sampler includes five circuit stages: a local oscillator section that may be used to drive the system, a shock wave generator that produces high frequency edge-sharpened pulses, a reflection damping clamping section, a delay section, and a sampler section regulated by the stream of shock waves which produces an IF output. The local oscillator or a pulse generator (not shown) produces an input that propagates down a nonlinear transmission line. Once this input reaches the shock wave generator section, it encounters a series of hyperabrupt diodes which are employed as voltage dependent capacitors called varactors. These varactors deform the input pulses and generate a stream of spike-shaped waveforms known as shock waves. The shock waves successively energize sampling diodes in the sampling section of the circuit. When these diodes are energized, they open pathways from an RF input to sampling capacitors which charge up with small representative bits of current from the input. A sample or snapshot of the input is drawn from these capacitors through an IF output coupling network. The clamping and delay sections of the sampler minimize spurious ringing throughout the circuit and manage the timing of the oscillation of these reflections. The entire sampler is monolithically integrated on a single substrate using conventional semiconductor fabrication and packaging techniques.

8 Claims, 7 Drawing Sheets

MONOLITHIC SAMPLER

BACKGROUND OF THE INVENTION

The present invention is a Monolithic Sampler that may be incorporated into a wide variety of instrumentation systems that are used to sample waveforms. More specifically, this innovative monolithic design constitues an improved extremely high speed sampler that utilizes a shock wave generator to achieve bandwidths that exceed 100 GHz (100 billion cycles per second).

The basic design of sampling circuits is well known to persons skilled in the art of electronics. At the most fundamental level, a sampler is an apparatus that mixes two signals: an input waveform that must be analyzed, and a periodic train of short duration pulses which samples the input waveform at different points in time along its radio frequency (RF) cycle. The input waveforms are reconstructed sample by sample at a lower intermediate frequency. A pulse generator or oscillator establishes the rate of measurement for the sampler. When coupled to some input source that produces a voltage that varies with time, the sampler takes a tiny sample or snapshot of the input waveform which can then be displayed or processed. The quality of the measurement provided by a sampler is largely dependent upon the number of times that an input signal is sampled and the duration of the sampling pulses. Generally, high measurement speed is accomplished by providing a successive stream of very narrow, rapid, sharply-defined pulses which, in turn, affords a more accurate detection or assay of the input.

In conventional electronic instruments, the highest measurable frequency is limited by design constraints and by the components which are employed. The most severe limitation that inhibits the extension of sampler bandwidths above 25 GHz has been the constrained capabilities of the pulse generators that drive conventional sampling circuits. The useable bandwidth of pulse or comb generators that have been used to drive conventional samplers is generally only one fourth of the sampler's bandwidth. The most common pulse generators use silicon step recovery diodes, which have performance limitations based upon the carrier transit time inherent in the silicon material from which they are fabricated.

Another factor which inhibits the high frequency capabilities of currently available sampling instruments are the relative inefficiency of the discrete electronic components which comprise their circuitry. Large discrete capacitors, resistors, and diodes mounted together on a printed circuit board require costly fabrication processes that depend upon precise mechanical alignment and inevitably cause unacceptably high levels of electrical feedthrough at the sampler input ports. Parasitic and inductive capacitance propagated by discrete components generates crosstalk among conductor lines in the circuit and severely degrades the output signal developed by the sampler. This interference also limits the highest possible intermediate frequency that can be extracted from the sampler. One known solution to these drawbacks is to form each of these discrete elements on a substrate which results in an integrated monolithic sampler.

The development of more and more complex electronic instrumentation has produced a concomitant demand for faster and more sophisticated sampling equipment. The problem of meeting this demand by producing an extremely high speed, accurate, and reliable sampler has presented a major challenge to designers in the electronics industry. The development of an improved sampler that could break the 100 GHz bandwidth barrier would represent a major technological advance in the field of electronic instrumentation. The enhanced quality of measurements that could be achieved using such an innovative device would satisfy a long felt need within the industry and would enable instrument manufacturers and users to save substantial expenditures of time and money.

SUMMARY OF THE INVENTION

The Monolithic Sampler claimed in this patent application overcomes the problem of inadequately low sampling rates and long sampling pulses that result from circuit designs or component limitations that constrain the bandwidths of previous instruments. The sampler includes five circuit stages: a local oscillator that may be used to drive the system, a shock wave generator that produces high frequency edge-sharpened pulses, a reflection damping clamping section, a delay section, and a sampler network regulated by the stream of shock waves which produces an IF output. The local oscillator or a pulse generator produces an input having a relatively slow rising edge that propagates down a nonlinear transmission line. Once this input reaches the shock wave generator section, it encounters a series of hyperabrupt Schottky diodes which are employed as voltage dependent capacitors called varactors. These varactors deform the input pulses and generate a stream of sawtooth-shaped waveforms known as shock waves. The shock waves successively energize sampling diodes in the sampling section of the circuit. When these diodes are energized, they open pathways from an RF input to sampling capacitors, which charge up with small representative bits of current from the input. The diodes are turned off by an opposite polarity shock wave which is generated by reflecting the incoming shock wave from a short circuit. A sample or snapshot of the input is drawn from these capacitors through an IF output coupling network. The duration of the sample is determined by the shockwave's roundtrip travel time between the diodes and the short circuit. The clamping and delay sections of the sampler minimize spurious ringing throughout the circuit and manage the timing of the oscillation of these reflections. These reflections are controlled so that they do not interfere with the operation of the shock wave generator and the sampling diodes.

The entire sampler is monolithically integrated on a single substrate using conventional semiconductor fabrication and packaging techniques. The resulting Monolithic Sampler is a highly efficient instrument which is extremely reliable and easy to manufacture. The integrated structure reduces unwanted inteference and eliminates the need for costly fabrication methods which require expensive tools that ensure the precise mechanical alignment of discrete components. The monolithic design eliminates component tolerance requirements and component temperature tracking which would be necessary if discrete circuit elements were employed. The utilization of the hyperabrupt diode loaded transmission line to generate shock waves enables the sampler to measure frequencies exceeding 100 GHz. This invention also provides the additional capability of providing the highest possible intermediate frequency that can be extracted from this type of sampler circuit. The Monolithic Sampler disclosed and claimed in this patent application provides an advanced and highly useful instrument that will enable engineers in the electronics industry to construct more cost-effective and powerful diagnostic and monitoring systems.

An appreciation of other aims and objectives of the present invention and a more complete and comprehensive understanding of this invention may be achieved by studying the following description of a preferred embodiment and by referring to the accompanying drawings.

BRIEF DESCRIPTION OF THE DRAWINGS

FIG. 4 shows the signal as a plot of voltage versus time when it enters the input end of the line, and FIG. 5 exhibits the resulting shock wave that is formed when the signal has transited down the line to its output end.

DESCRIPTION OF A PREFERRED EMBODIMENT

Background: Nonlinear Transmission Lines

A complete understanding and appreciation of the improvements achieved by the present invention requires a brief explanation of nonlinear transmission line theory. The present invention utilizes a shock wave generator to form a stream of very narrow, high-speed, sharp-edged pulses to activate circuitry that takes minute snapshots or samples of an input waveform. These sharp pulses are analogous to the period of time that a shutter is opened in a camera that takes an extremely rapid sequence of photographs. The measure of sharpness of the pulses is directly proportional to the inclination or slope of its leading edge. The sharpest or ideal pulse would begin at zero volts and rise to some operating amplitude voltage A in the shortest possible time. A shock wave is very close to this ideal waveform: it has an exceedingly short rise time, so that, when plotted in a graph of voltage versus time, its leading edge resembles a nearly vertical spike whose slope approaches infinity and then flattens out to zero once its voltage reaches some operating amplitude A. The rise time of the diode is, however, limited by the resistive losses inherent in the diodes. Shock waves can be formed in a nonlinear transmission line by deliberately distorting input pulses that look more like sinusoids with gently-sloped leading edges.

Figure 1:
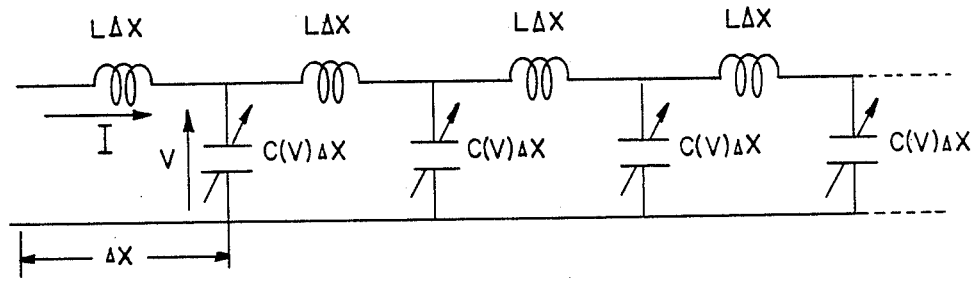
FIG. 1 is a schematic illustration of a nonlinear transmission line bridged by varactors.

FIG. 1 illustrates a generalized nonlinear transmission line comprising two conductors bridged by voltage-dependent capacitors, which are also called varactors. Each segment $\Delta x$ has an inherent inductance represented in the drawing as $L*\Delta x$. When a sinusoid or sawtooth signal is impressed upon one side of this transmission line, it propagates through it, and, after some time period, reaches the opposite end. The speed or phase velocity of such a signal moving down the transmission line is given by the expression:

$$V_p = 1/[LC(v)]^{\frac{1}{2}} \{\text{in meters/sec}\} \qquad \text{Equation 1.}$$

Where
- L = inductance per unit length in henrys/meter;
- C(v) = nonlinear capacitance per unit length in farads/meter;
- $V_p$ = voltage along the nonlinear transmission line in volts; and
- I = current along the nonlinear transmission line in amperes, as shown in FIG. 1.

The phase velocity, $V_p$, is therefore inversely proportional to the square root of the capacitance of the varactor, C(v), which, in turn, depends upon the voltage across the varactor. Varactors which exhibit nonlinear and greatly varying capacitance for a given range of voltages are called "hyperabrupt" varactors. The functional relationship for a hyperabrupt diode varactor is given by the following equation:

$$C(V) = C_{jo}/(1 + V/\phi)^m \qquad \text{Equation 2.}$$

Where
- m = the capacitance grading coefficient, which is typically $\frac{1}{2}$ for abrupt junction diodes and greater than one half for hyperabrupt junction diodes;
- $C_{jo}$ = zero bias junction capacitance (when V=0); and
- $\phi$ = the built-in voltage of a GaAs Schottky diode varactor, typically 0.72 V.

Figure 2:
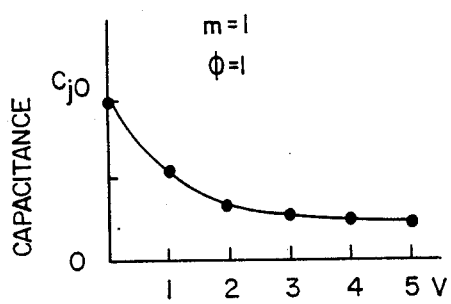
FIG. 2 is a graph which shows the relationship between capacitance and the voltage imposed across a hyperabrupt varactor.
Figure 3:
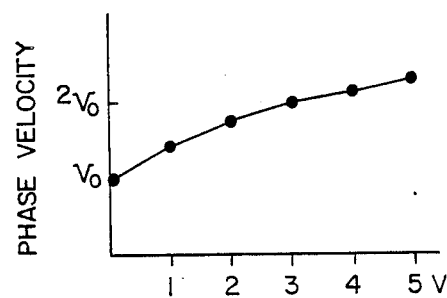
FIG. 3 is a plot that depicts the dependence of the phase velocity at which a signal travels down a nonlinear transmission line (as shown in FIG. 1) upon the voltage of the signal which appears across a hyperabrupt varactor.

FIG. 2 depicts a graph of capacitance versus voltage for a hyperabrupt varactor where m and $\phi$ both equal unity. If a shock wave generator incorporates hyperabrupt varactors, the capacitance presented by the varactor will be high for low voltages and will decrease rapidly for higher voltages. When the function portrayed in FIG. 2 and delineated in Equation 2 is figured into Equation 1, the plot shown in FIG. 3 is generated. This graph depicts a gradual increase in the phase velocity of a signal moving down a nonlinear transmission line as the voltage of that signal increases. FIG. 3 predicts that if two signals having a different amplitude are impressed across the same line at the same time, the signal with the higher voltage will reach the end of the line before the slower signal will complete its own trip.

Figure 4:
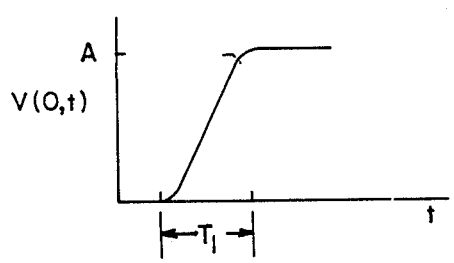
FIGS. 4 and 5 reveal the change in a waveform as it travels down the nonlinear transmission line pictured in FIG. 1.

From the standpoint of explaining the function of a shock wave generator, the critical principle that evolves from this theory is that when a waveform travels down a nonlinear transmission line, different portions of the same waveform will arrive at the end of the line at different times, depending on the amplitude or voltage of each distinct portion of that waveform. Specifically, FIG. 4 presents a waveform that has a leading edge having a low amplitude which rises to amplitude A after a period of time $T_i$. If this signal were to travel down the nonlinear transmission line portrayed in FIG. 1, the high voltage portion of this signal would travel down the line at a greater speed than the low amplitude portion of the signal. Due to this nonlinearity, eventually, the high voltage portion of the signal would gain on its own leading low voltage portion due to its higher propagation speed and would catch up to it producing a shock wave. At the moment that the high voltage part of the waveform catches up, both parts of the signal would be superimposed, as shown in FIG. 5.

Figure 5:
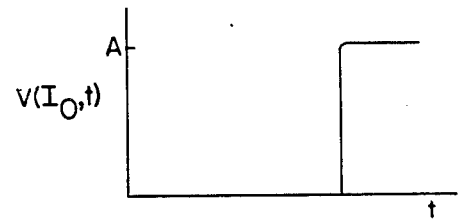

This spike depicted in FIG. 5 is the shock wave that can be put to good use in the sampler circuit. The most important factor in developing the shock wave is the configuration of a transmission line which is sufficiently long to allow the high voltage portions of input waveforms to catch the lower voltage portions and form shock waves. The critical line length, $l_B$, where shock waves are synthesized is given by the following expression:

$$l_B = (v_{po} * T_i)/(1 - \{v_{po}/v_{pA}\})$$

Where $v_{po}$ = the phase velocity of the signal when V is substantially zero;

$T_i$ = the input transition time between V=0 and V=A; and $v_{pA}$ = the phase velocity of the signal when V=A.

By selecting the appropriate interval $l_B$ along the transmission line, a shock wave generator can be designed that will supply a rapid sequence of edge-sharpened pulses for an sampler circuit that will provide unprecedented sampling bandwidths exceeding 100 GHz.

A Schematic Description of the Sampler Circuit Configuration

Figure 6:
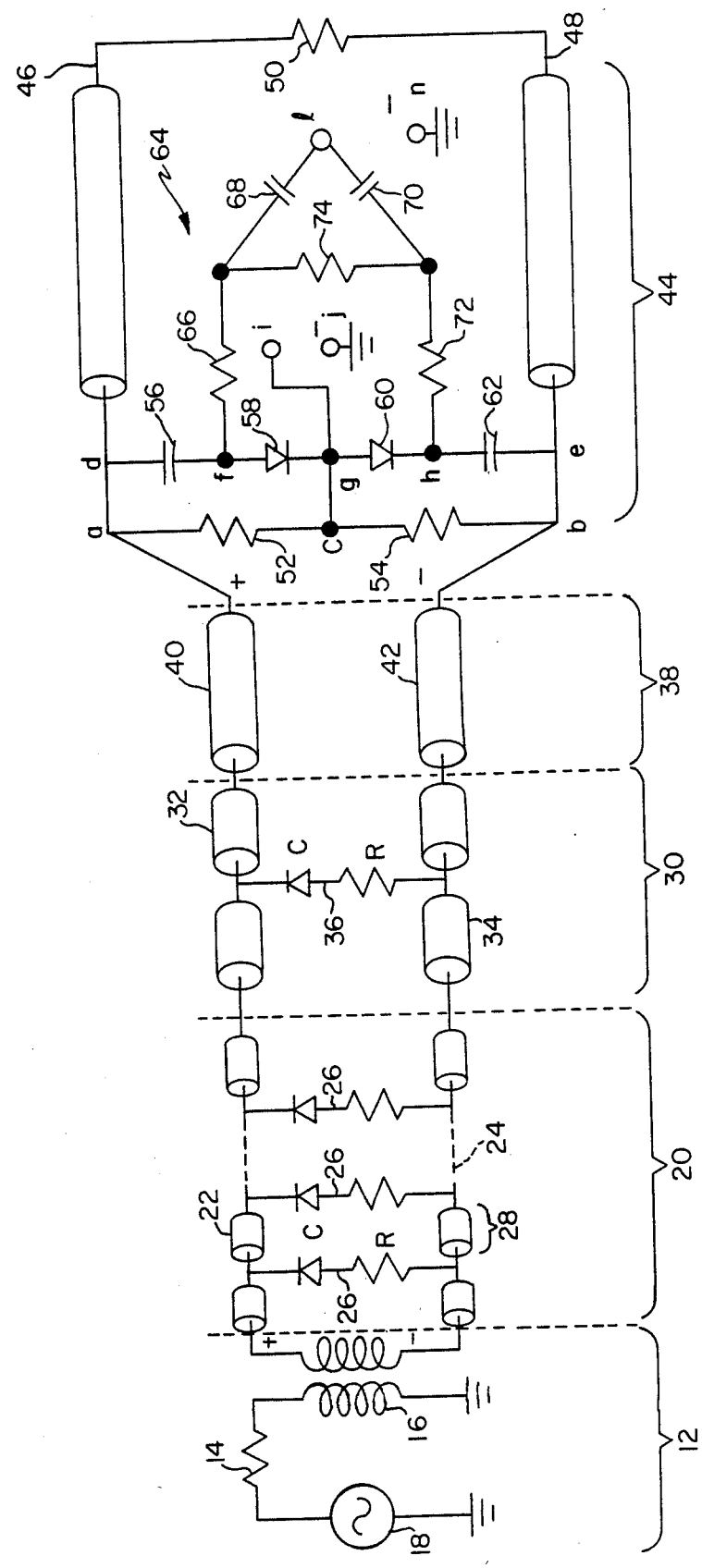
FIG. 6 is a schematic circuit diagram of the present invention.

FIG. 6 presents a schematic diagram of the sampler circuit 10. A local oscillator stage 12 includes a source resistor 14 in series with the input side of a balanced transformer 16 which is driven by a local sinusoidal oscillator 18. A detailed explanation of the balanced transformer 16 which is incorporated into the sampler circuit 10 may be found in the text entitled *Microstrip Lines and Slotlines* by K. C. Gupta et al., published by Artech House in Dedham, Mass. in 1979. A shock wave generator stage 20 comprises a nonlinear transmission line that has an upper and lower branch 22 and 24. A plurality of shock wave generator stage varactors 26 span the two conductors of the transmission line 22 and 24 at carefully selected intervals 28. A clamping diode stage 30 follows the shock wave generator 20. One clamping diode stage varactor 36 bridges an upper and a lower branch of the transmission line 32 and 34 in this section of the sampler 10.

A delay stage 38 having unloaded transmission line conductors 40 and 42 lies between the clamping diode stage 30 and a sampling stage 44. This final section includes a transmission line with upper and lower conductors 46 and 48 in series with a resistive short 50. A number of junctions or nodes along circuit pathways and loops within the sampler stage 44 are labeled with lower case letters [a] through [n] to help the reader locate particular components. A first RF (radio frequency) input termination resistor 52 is connected to node [a] on line 46 and to a second RF input termination resistor 54 at node [c], which is also connected to line 48 at node [b]. A first sampling capacitor 56 is connected to transmission line 46 at node [d] and to the positive terminal of a first sampling diode 58 at node [f]. The negative terminal of first sampling diode 58 is connected to the positive terminal of second sampling diode 60 at node [g]. A second sampling capacitor 62 completes this pathway through its coupling to second sampling diode 60 at node [h] and to transmission line 48 at node [e]. A conductor joins nodes [c] and [g] to a node [i] which serves as the positive terminal of an RF input, which is paired with a grounded terminal at node [j].

An IF (intermediate frequency) coupling network 64 lies within sampling stage 44. This network 64 is a loop which starts at node [f] and ends at node [h]. The components in network 64 that are arranged in series include a first IF output coupling resistor 66 between nodes [f] and [k], a first IF output coupling capacitor 68 between nodes [k] and [l], a second IF output coupling capacitor 70 between nodes [l] and [m], and a second IF output coupling resistor 72 between nodes [m] and [h]. A third IF output coupling resistor 74 bridges nodes [k] and [m]. Node [l] and a grounded node [n] serve as terminals for the IF output of the sampler.

Design Considerations and Specifications for a Preferred Embodiment

The varactors 26 and 36 shown in FIG. 6 may be any device which functions as a nonlinear voltage-dependent capacitor. In the best mode of the invention, hyperabrupt GaAs Schottky diodes are employed. They are represented in the schematic diagram by both diode and resistor symbols in order to account for the intrinsic resistance of the components. The hyperabrupt diodes are selected for their pronounced nonlinear capacitance versus voltage characteristic. This greater nonlinearity of these components enables the designer to achieve narrower and sharper-edged pulses using a relatively short nonlinear transmission line 22, 24. The zero bias junction capacitance of the diodes 26, $C_{jo}$, and the spacing 28 between the diodes are selected so that the large signal impedance of the loaded line 22, 24 is 50 ohms and so that the cutoff frequency is much higher than the spectral frequencies of the desired shock wave pulses.

In contrast, the diode varactor 36 in the clamping diode section 30 has a smaller $C_{jo}$ and a larger series resistance than the shock wave generator diodes 26 to minimize spurious ringing produced by reflections within the sampler circuit 10. The relatively small $C_{jo}$ value affords a lower "on" conductance to absorb more power while retaining the same $RC_{jo}$ time constant. The product $RC_{jo}$ is kept constant to minimize degradation of the leading edge of the shock wave by section 30. The larger series resistance, R, reduces reflections by absorbing more power. The signal reflected from sampling section 44 has opposite polarity to the incoming signal and therefore forward biases the diode in clamping section 30. As a result of this, the reflected signal experiences a resistive load at clamping diode 36 and is therefore strongly absorbed.

The choice of transmission line for this sampler is generally only limited by particular monolithic integration objectives which are discussed in detail below. Any combination of well-known and widely available transmission lines may be used. These include microstrip, coplanar waveguide, coplanar line, and various slotline configurations. The unloaded characteristic impedance of the transmission line 22, 24 is chosen to be as high as possible, up to an impedance which would create an unacceptably high level of intrinsic dispersion that would, in turn, degrade the short rise times of the shock wave generator pulses. A high unloaded impedance also permits large capacitive loading due to the capacitance of the diode varactors 26 that generate sharp-edged pulses. The length of each spacing 28 is chosen such that its associated delay is much shorter than the rise time of the shock wave produced in section 20. A high unloaded impedance yields a high inductance per unit length and a low capacitance per unit length that facilitate a shorter overall line length for the shockwave generator section. The delay section 38 includes unloaded transmission line 40, 42 with a 50 ohm characteristic impedance. The length of the delay section 38 is chosen so that the reflected signals do not interface with the leading edge of the shock wave. This requires that the delay introduced by this section 38 is at least twice the rise time of the shock wave pulses produced by section 20.

In the sampling stage 44, resistive short 50 provides a very low resistance that functions as a shorted transmission line. This component is the terminus of the sampler circuit 10 which produces reflections back down the lines 46 and 48 toward the local oscillator stage 12. This shorted section sends back an opposite polarity reflected wave which shuts off the sampling diodes. The total round trip travel time of a pulse from the end of section 30 to resistive short 50 and back to the end of section 30 should be less than the pulse repetition rate to prevent interference between successive pulses.

Based upon actual simulations performed by the inventors using the SPICE software package, the specifications for the various components and parameters in the preferred embodiment of the circuit 10 are presented in the following table:

TABLE ONE

| Local Oscillator Stage 12 | |
|---|---|
| Source resistor 14 | 50 ohms |
| Shock Wave Generator Stage 20 | |
| Unloaded transmission line impedance, $Z_o$ | 203.5 ohms |
| Transmission time delay between diodes 26 | 0.39 pico sec |
| Zero bias junction capacitance, $C_{jo}$ | 210 fF |
| Diode junction dopant grading coefficient, m | 1.5 |
| Diode series resistance | 15 ohms |
| Number of diodes 26 | 15 |
| Clamping Diode Stage 30 | |
| Unloaded transmission line impedance, $Z_o$ | 57 ohms |
| Transmission time delay | 1.4 pico sec |
| Zero bias junction capacitance, $C_{jo}$ | 50 fF |
| Diode junction dopant grading coefficient, m | 1.5 |
| Diode series resistance | 25 ohms |
| Number of diodes 36 | 1 |
| Delay Stage 38 | |
| Transmission line impedance, $Z_o$ | 50 ohms |
| Transmission line time delay | 15 pico sec |
| Sampling Stage 44 | |
| RF input termination resistors 52 and 54 | 100 ohms |
| Sampling capacitors 56 and 62 | 2 pF |
| Sampling diodes 58 and 60: | |
| Zero bias junction capacitance, $C_{jo}$ | 100 fF |
| Junction dopant grading coefficient, m | 1.5 |
| Series resistance | 1 ohm |
| IF output coupling resistors 66 and 72 | 5 ohms |
| IF output coupling resistor 74 | 90 ohms |
| IF output coupling capacitors 68 and 70 | 4 pF |
| Shorted transmission line impedance, $Z_o$ | 50 ohms |
| Shorted transmission line delay | 5 pico sec |

TABLE ONE-continued

| | |
|---|---|
| Resistance of resistive short 50 | 15 ohms |

Operation of the Sampler and Experimental Results

To initiate the operation of the sampler 10, a radio frequency input that is to be sampled is applied across terminals [i] and [j] shown in FIG. 6. The impedance of the input is matched to 50 ohms.

A sampling signal from the local oscillator stage 12 enters the shock wave generator stage 20, and the nonlinearity in the diodes 26 produce a steepened edge that is used to drive the sampler. For some high intermediate frequency applications, the pulse generator may be eliminated and the sampler 10 can be driven by the sinusoidal local oscillator 18. The upper and lower branches of the transmission line 22 and 24 are polarized positive and negative as shown in FIG. 6 by the "+" and "−" signs. As a result of this polarity, the leading edges of the input pulses drives each of the diodes 26 into a reverse bias condition. The shock waves that are produced by this input travel down the transmission lines and enter the sampling stage 44 at nodes [a] and [b]. Due to the arrangement of sampling diodes 58 and 60, first sampling diode 58 is forward biased or turned on by the positive voltage that is imposed across it from node [d] to node [e]. Second sampling diode 60 is also forward biased or turned on because the negative potential placed across at from node [e] to [d]. When both diodes 58 and 60 are turned on by the shock wave pulses, small samples of current flow through the pathway from node [d] to node [e]. Differences between the charge captured by sampling capacitors 56 and 62 cause a current to flow through the IF coupling network 64, which includes bleeding resistors 66, 72, and 74. The resistance of these three resistors is minimized to allow for a high pulse repetition rate. The ratio of the resistance of resistor 74 to the sum of resistors 66 and 72 is maximized to afford the highest possible IF conversion efficiency. Capacitors 68 and 70 do not store any sampled current, their purpose is to block DC current that might otherwise flow through network 64. Resistors 52 and 54 that lie between nodes [a] and [b] are load resistors which absorb the RF signal in the sampler stage 44.

Resistive short 50 is a low impedance terminus to the transmission line. This section of the transmission line differentiates the shock wave to produce a narrow pulse with a width equal to twice the transmission line delay. Once signals reach the resistive short 50, they bounce back towards the opposite end of the transmission line as inverted polarity reflections. These reflected waveforms invert the bias of the sampling diodes and turn them off, determining the time duration of the sampling pulse. These reflections also produce spurious ringing that is controlled by the clamping diode stage 30. Without the clamping section in place, the reflected waves would forward bias the shock wave generator varactors 26. A second reflection back toward the sampling stage 44 would turn on the sampling diodes 58 and 60 at the wrong time. The clamping diode 36 has a lower forward bias conductance than the varactor diodes 26, and therefore reduces the reflection returned to the sampling diodes 58 and 60. The clamping diode 36 also has a higher series resistance which reduces reflections by absorbing more power.

Figure 7:
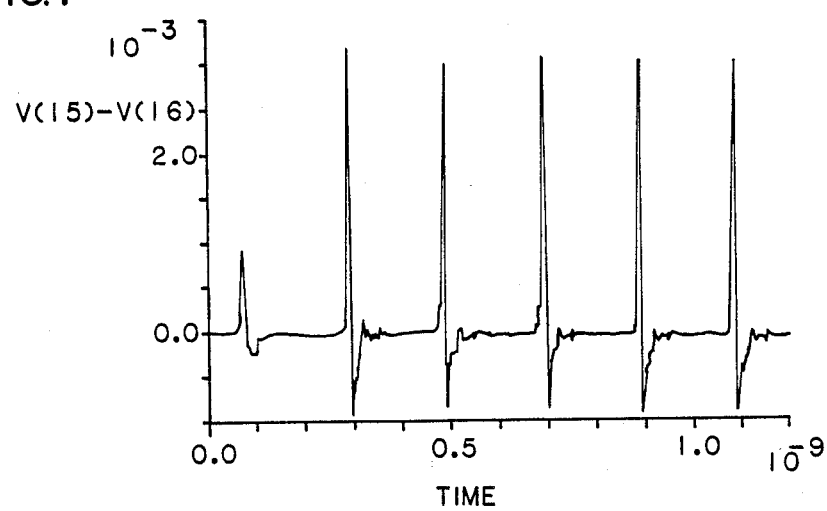
FIGS. 7 and 8 display simulation results obtained by the inventors that exhibit the benefits achieved using their invention.
Figure 8:
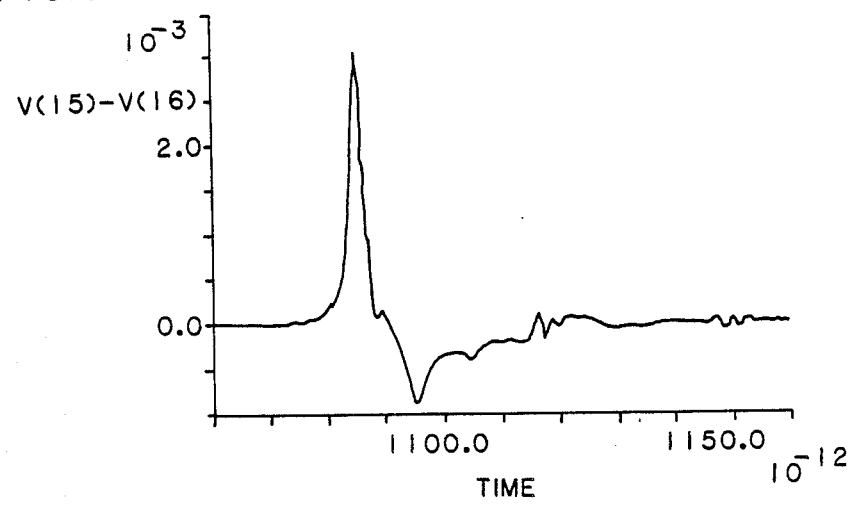

The mixed IF output of the sampler 10 is taken from terminals [l] and [n]. FIGS. 7 and 8 illustrate simulation results which portray the current pulses through the sampling diodes 58 and 60. FIG. 8 is an expanded picture (10 picoseconds per division) of one of the pulses shown in FIG. 7. The graphs plot current through the sampling diodes showing a 2.6 pico second full width at half maximum, which represents a 3 dB bandwidth of approximately 134 GHz.

Fabrication of the Monolithic Sampler

Figure 9A:
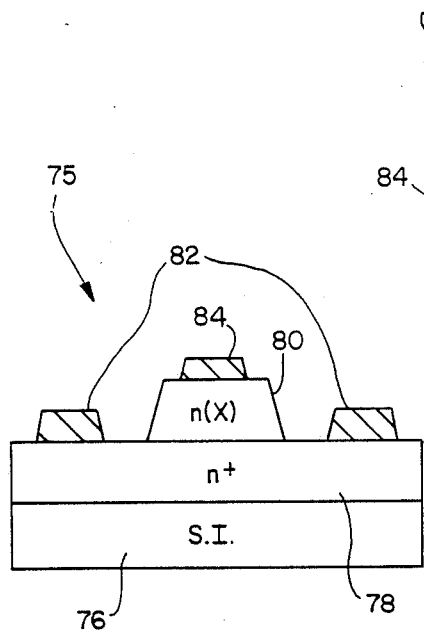
FIGS. 9 (a), (b), and (c) depict the monolithic structure of portions of the invention.
Figure 9B:
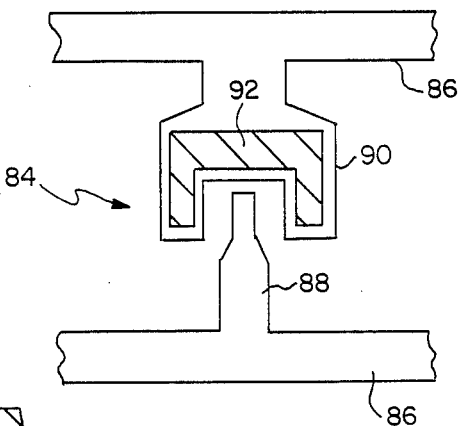
Figure 9C:
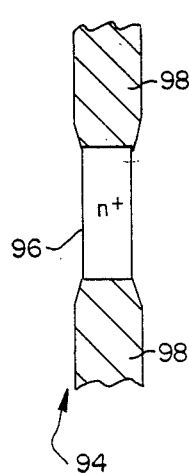
Figure 10:
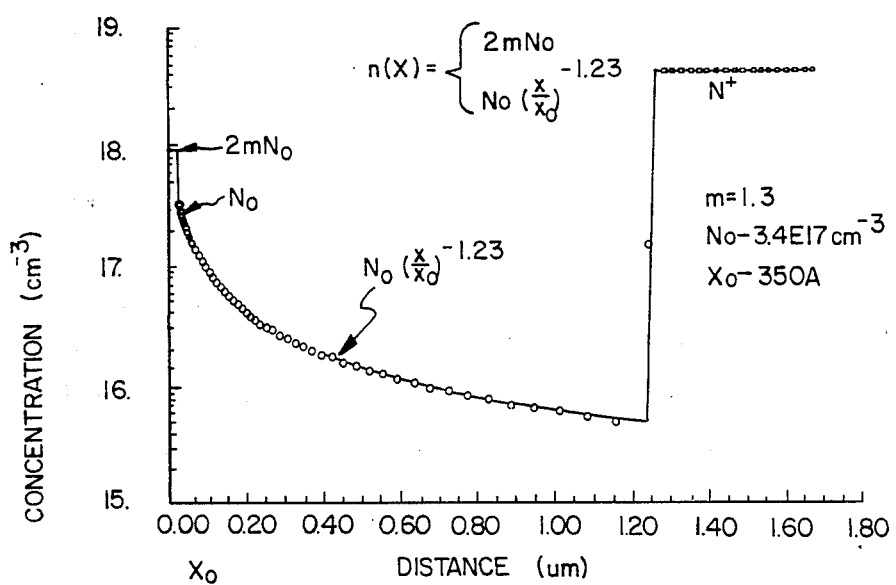
FIG. 10 reveals the graph of the equation that is used to create the doping profile across the n(x) layer of the monolithic diodes.
Figure 11:
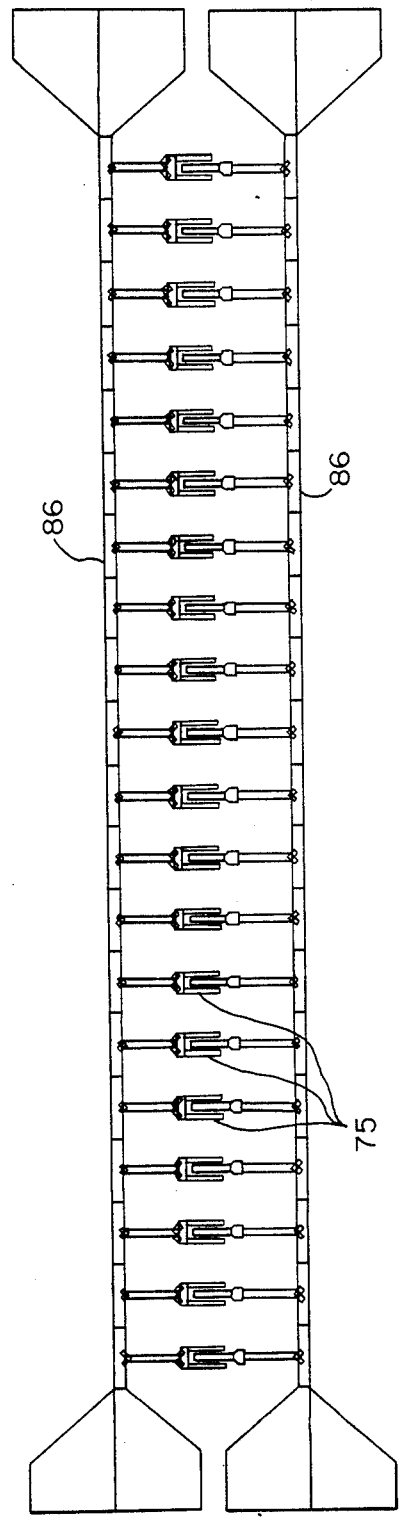
FIG. 11 portrays a series of hyperabrupt diodes formed across two transmission lines.

The monolithic implementation of the sampler circuit design which is described above is accomplished using conventional photolithographic techniques. FIG. 9(a) illustrates a side view of a diode 75 formed on a semiinsulating (S.I.) gallium arsenide (GaAs) substrate 76. These diodes 75 may be varied to produce any of the diodes 26, 36, 58, or 60 discussed above. Molecular beam epitaxy techniques are then employed to grow an n+ layer 78 over the S.I. substrate 76. The top layer 80 is a hyperabrupt doping strata called an n(x) layer that is also formed using molecular beam epitaxy methods. This doping profile n(x) yields the necessary capacitance variation described in equation (2) above. The m value in that equation determines the doping profile n(x). After individual diodes are isolated by proton bombardment and portions of the n(x) layer are etched, ohmic contacts 82 are deposited from titanium-gold-germanium alloys and a Schottky contact 84 is deposited using titanium-platinum-gold metal. FIG. 9(b) illustrates a deposited Schottky contact 85 in a top view. A pair of transmission lines 86 (which are referred to above as 22, 24, 32, 34, 40, 42, 46, and 48) are coupled through tongue and yoke portions 88 and 90. An ohmic contact 92 is shown formed onto the yoke portion 90. FIG. 9(c) depicts a monolithically fabricated resistor 94, which includes an n+ strip joined to ohmic contacts 98 at either end. Capacitors are formed by separating two plates of connect metal by a dielectric like silicon nitride. The silicon nitride is also used as a passivating layer for the other components. The resistors and capacitors shown in FIGS. 9a, 9b and 9c are fabricated so that they take on various values to produce capacitors 56, 62, 68, and 70 and resistors 50, 52, 66, 72, and 74. The functions that are used to determine the appropriate doping level are shown in FIG. 10. FIG. 11 illustrates a completed array of diodes 75 (which may be altered to produce diodes 26, 36, 58, or 60) spanning a pair of transmission lines 86.

Figure 12:
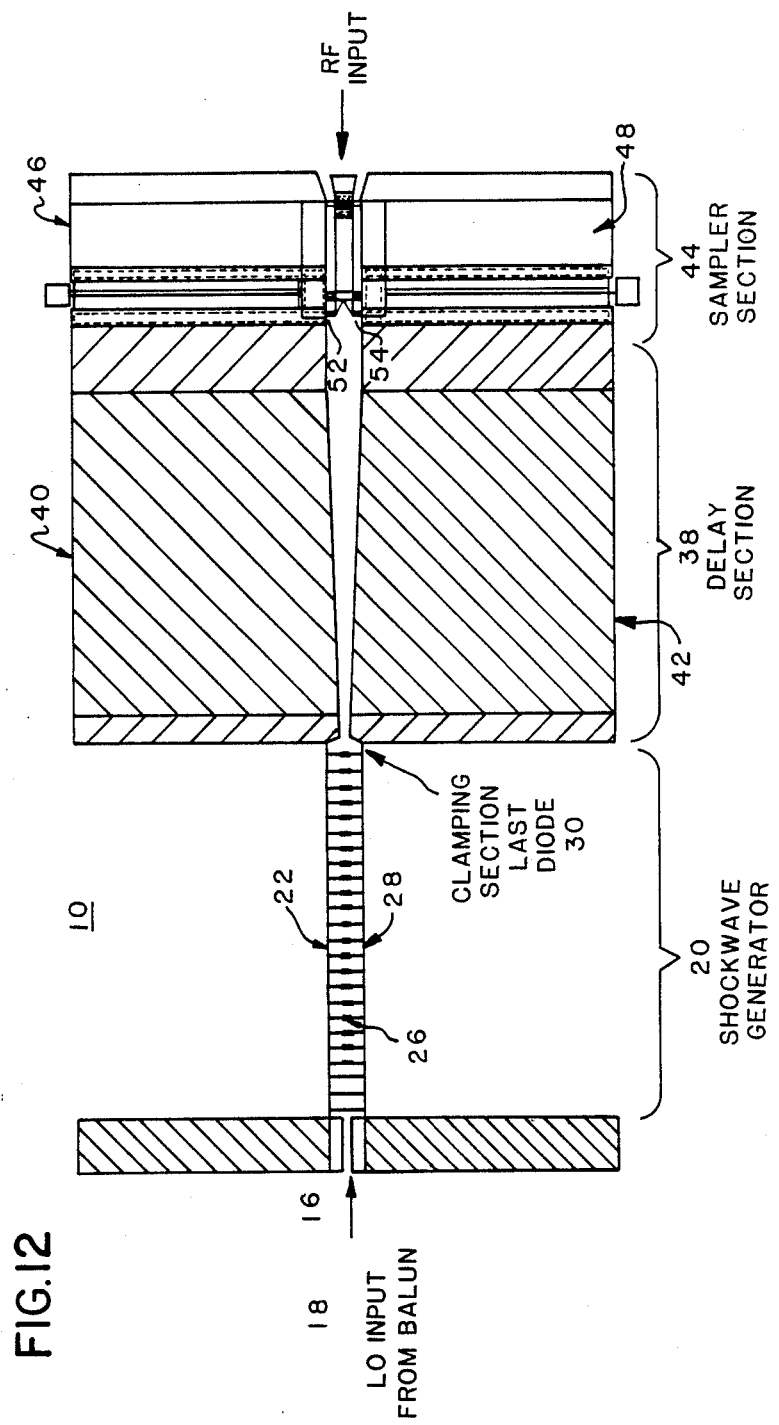
FIG. 12 exhibits a schematic view of the monolithic integration of the entire sampler circuit.
Figure 13:
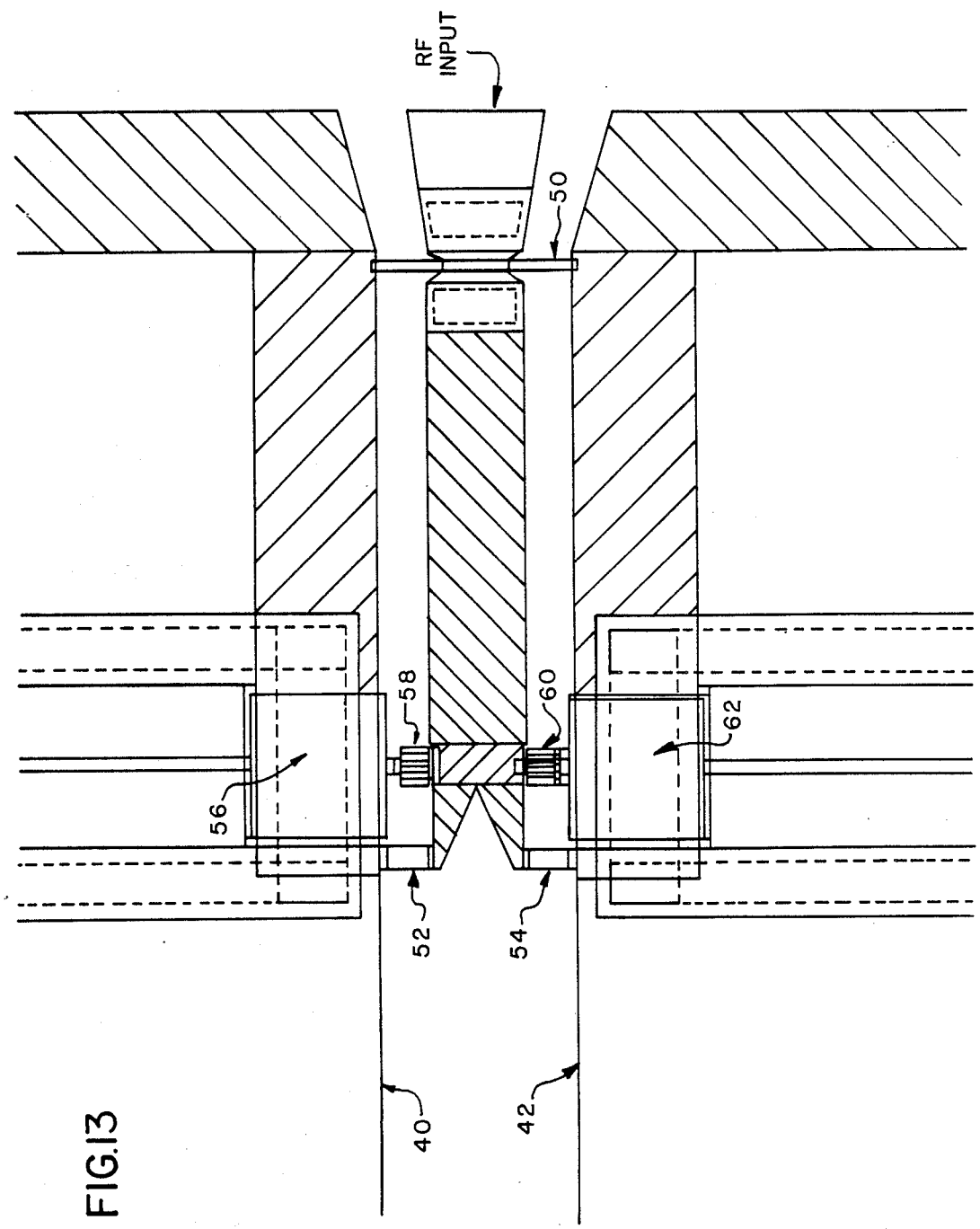
FIG. 13 illustrates an expanded view of a portion of the drawing shown in FIG. 12.

FIG. 12 exhibits the complete Monolithic Sampler in a schematic view. An input from local oscillator 18 is passed through balun 16 to the shockwave generator section 20 that includes transmission lines 22 and 28 spanned by diodes 26. The output end of the shockwave generator 20 is coupled to delay section 38 through clamping section 30. Finally, the shockwaves enter sampler section 44, which is shown in an enlarged view in FIG. 13. Transmission line sections 40 and 42 convey the shock waves into sampler section 44 past resistors 52 and 54 into capacitors 56 and 62. Sampling diodes 58 and 60 are shown in series between capacitors 56 and 62 and an RF input.

Although the present invention has been described in detail with reference to a particular preferred embodiment, persons possessing ordinary skill in the art to which this invention pertains will appreciate that various modifications and enhancements may be made without departing from the spirit and scope of the claims that follow.

What is claimed is:

1. A sampler circuit comprising:
   a means for providing a signal from a local oscillator;
   a means for generating shock waves coupled to said means for providing a local oscillator signal; said means for generating shock waves including a nonlinear transmission line spanned by a plurality of varactors; and
   a means for sampling an input signal coupled to said means for generating shock waves, said means for sampling including:
      a pair of sampling capacitors coupled to a pair of sampling diodes and an IF output network that includes a positive terminal and a grounded terminal which together produce an IF sampled output.

2. A sampler circuit as in claim 1, further comprising:
   a clamping means coupled to said means for generating shock waves; said clamping means including a varactor.

3. A sampler circuit as in claim 2 further comprising:
   a means for inserting a signal delay coupled to said clamping means.

4. A sampler circuit as in claim 1 wherein the varactors in said means for generating shock waves are each hyperabrupt varactors.

5. A sampler circuit as in claim 1 wherein the hyperabrupt varactors are Schottky hyperabrupt diodes.

6. A sampler as claimed in claim 2, in which said nonlinear shock wave generator section varactors are hyperabrupt varactors.

7. A sampler as claimed in claim 2 which includes a pulse generator in place of said local oscillator.

8. A sampler circuit comprising:
   a local oscillator stage including a source resistor in series with a balanced transformer and a local oscillator;
   a shock wave generator stage coupled to said local oscillator stage, said shock wave generator stage including:
      a two-conductor, balanced, edge-sharpening, nonlinear transmission line spanned by a plurality of uniformly distributed nonlinear shock wave generator section varactors which are spaced apart on said transmission line at a preselected distance and which are each connected to said transmission line in the same polarity;
   a clamping diode stage coupled to said shock wave generator stage, said clamping diode stage including:
      a transmission line spanned by a clamping diode stage nonlinear varactor coupled in the same polarity as said shock wave generator section varactors; said clamping diode stage nonlinear varactor further having a smaller zero-bias capacitance and a larger series resistance than said shock wave generator stage varactors;
   a delay stage coupled to said clamping diode stage, said delay stage including:
      an unloaded transmission line having a predetermined impedance designed to damp a reflected signal propagating toward said local oscillator stage along said unloaded transmission line; and
   a sampling stage coupled to said delay stage, said sampling stage including:
      a transmission line including a first group of nodes [a], [b], [d], and [e]; said transmission line terminating in a resistive short;

a pair of RF input termination resistors connected in series between said nodes [a] and [b] and defining a node [c] between them;

a first sampling capacitor, a first sampling diode, a second sampling diode aligned in the same polarity as said first sampling diode, and a second sampling capacitor connected in series between said nodes [d] and [e] and defining a second group of nodes [f], [g], and [h] between them;

a pair of RF input terminals [i] and [j], said terminal [i] being connected to said node [g] between said first and second sampling diodes, said terminal [j] being grounded;

an IF output coupling network coupled within said sampling diode stage at nodes [f] and [h]; said IF coupling network including, in series:
  a first IF output coupling resistor connected to said node [f],
  a node [k],
  a first IF output coupling capacitor,
  an IF terminal [l],
  a second IF coupling capacitor,
  a node [m],
  a second IF output coupling resistor connected to said node [h]; and said IF output network further including a third IF output coupling resistor and a grounded terminal [n], which, together with said terminal [l], produces an IF sampled output.

* * * * *